United States Patent [19]

Dixon, Jr. et al.

[11] Patent Number: 4,563,773

[45] Date of Patent: Jan. 7, 1986

[54] MONOLITHIC PLANAR DOPED BARRIER SUBHARMONIC MIXER

[75] Inventors: Samuel Dixon, Jr., Neptune; Roger J. Malik, Summit, both of N.J.

[73] Assignee: The United States of America as represented by the Secretary of the Army, Washington, D.C.

[21] Appl. No.: 588,612

[22] Filed: Mar. 12, 1984

[51] Int. Cl.$^4$ ............................................. H04B 1/26
[52] U.S. Cl. ..................................... 455/327; 455/330
[58] Field of Search ............................... 455/325–328, 455/330

[56] References Cited

U.S. PATENT DOCUMENTS 4,320,536  3/1982  Dietrich .............................. 455/327

FOREIGN PATENT DOCUMENTS 71917  6/1979  Japan .................................. 455/330

OTHER PUBLICATIONS

"A Subharmonic Mixer Using a Planar Doped Barrier Diode with Symmetric Conductance", by Malik et al., 7/1982.

Primary Examiner—Jin F. Ng
Attorney, Agent, or Firm—Anthony T. Lane; Jeremiah G. Murray; Edward Goldberg

[57] ABSTRACT

A single planar doped barrier diode is grown by the selective deposition of gallium arsenide using molecular beam epitaxy (MBE) in the center of a gallium arsenide dielectric waveguide member mounted on a ground plane. The waveguide member includes two portions which extend in opposite directions and terminating in respective metal to dielectric waveguide transition sections which are coupled to an RF input signal and local oscillator signal, respectively. The planar doped barrier diode operates as an intrinsic subharmonic mixer and accordingly the local oscillator signal has frequency of one half the input signal frequency. An IF output signal is coupled from the mixer diode to a microstrip transmission line formed on an insulating layer fabricated on the ground plane. Dielectric waveguide isolators are additionally included on the dielectric waveguide segments to mutually isolate the input signal and local oscillator signal. A monolithic form of circuit fabrication is thus provided which allows the planar doped barrier mixer circuit to be extremely small and the cost of mass producing such a circuit to be very economical.

13 Claims, 2 Drawing Figures

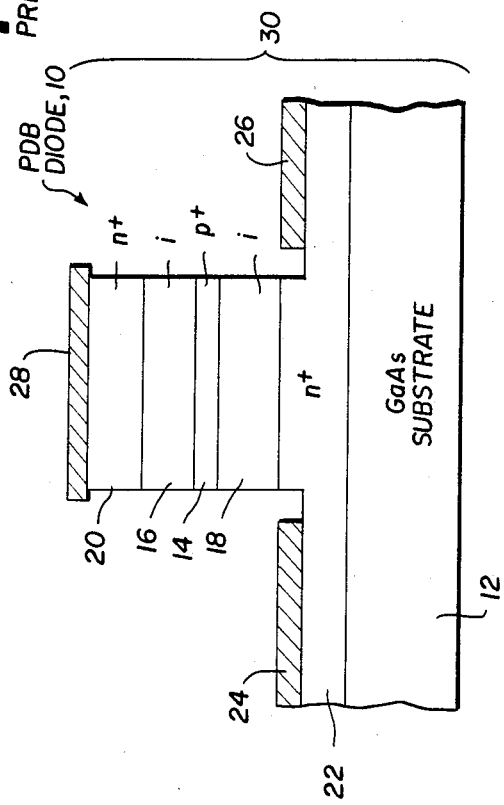
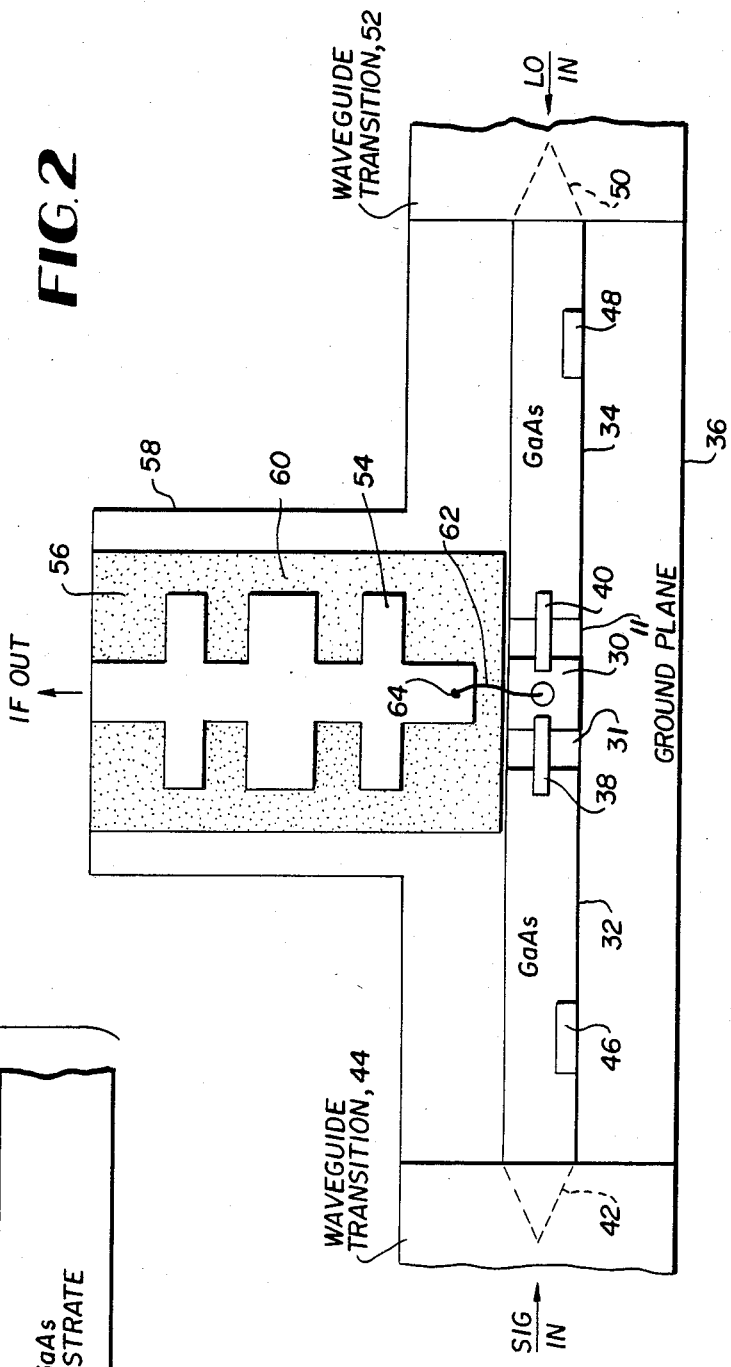

MONOLITHIC PLANAR DOPED BARRIER SUBHARMONIC MIXER

The invention described herein may be manufactured and used by or for the Government for governmental purposes without the payment of any royalties thereon or therefor.

FIELD OF THE INVENTION

This invention relates generally to signal mixers and more particularly to a subharmonically pumped mixer for operation at millimeter wave frequencies.

BACKGROUND OF THE INVENTION

Presently known balanced mixer devices require two separate diodes for their operation. Typically such diodes comprise Schottky barrier diodes where operation is required in the millimeter wave frequency range. Due to the requirement of two such diodes, the fabrication of monolithic type signal mixer circuits becomes relatively complex in their construction.

On Oct. 18, 1983, one of the present inventors, Roger J. Malik, was granted a patent, U.S. Pat. No. 4,410,902, for a "Planar Doped Barrier Semiconductor Device", which is comprised of an n+-i-p+-i-n+ semiconductor diode structure wherein an extremely narrow p+ planar doped region is positioned in adjoining regions of nominally undoped (intrinsic) semiconductor material and is fabricated in accordance with a known process called "Molecular Beam Epitaxy" wherein the device is grown on a semiconductor substrate such as gallium arsenide. By varying the acceptor charge density and the undoped region widths, low barrier heights can be obtained and can be used to replace Schottky barrier devices which exhibit relatively large barrier heights and thus reduce the power requirements for the application intended.

Accordingly, it is an object of the present invention to provide a means for mixing an input signal with a local oscillator signal to provide an intermediate frequency output signal.

It is another object of the present invention to provide a signal mixer which operates in the millimeter wave frequency band.

Still another object of the invention is to provide a signal mixer fabricated as a monolithic integrated circuit structure.

SUMMARY

Briefly, these and other objects are accomplished by a subharmonically pumped signal mixer designed to operate in the millimeter wave frequency band and comprises a structure utilizing a single planar doped barrier diode device grown by selective deposition of gallium arsenide located in a centrally located etched out portion of a semi-insulating dielectric gallium arsenide waveguide member located on a conductive ground plane. The waveguide member at each end terminates in metal to dielectric waveguide transition sections which are coupled to the input signal and a local oscillator signal of one half the frequency of the input signal. Biconical transformer means couple the planar doped barrier diode to the dielectric waveguide member to insure optimum impedance match. An IF circuit comprising a microstrip transmission line including a low pass filter is coupled to the planar doped barrier diode for coupling an IF output signal away from the structure.

BRIEF DESCRIPTION OF THE DRAWINGS

FIG. 1 is a partial cross sectional view illustrative of a planar doped barrier diode device of the known prior art; and FIG. 2 is a top planar view of an integrated circuit structure illustrative of the preferred embodiment of the invention.

DETAILED DESCRIPTION OF THE PREFERRED EMBODIMENT

Before considering the subject invention in its details, reference will be first made to FIG. 1 which discloses a monolithic semiconductor device known as a planar doped barrier diode, and which is further disclosed in detail in the above referenced U.S. Pat. No.4,410,902. Such a device is comprised of an n+-i-p+-i-n+ layered structure grown on a substrate 12 consisting of a group III-V compound, preferably gallium arsenide (GaAs). As shown in FIG. 1, the diode 10 is comprised of a relatively narrow highly doped p+ planar region 14 located within intrinsic or nominally undoped regions 16 and 18 consisting of upper and lower contiguous i planar regions bordered respectively by highly doped n+ surface and buffer planar regions 20 and 22. Two layers of metallization 24 and 26 are laid down on the n+ buffer region 22 while a third contact layer 28 is formed on the top of the upper n+ surface region 20. These three layers of metallization 24, 26 and 28 are typically formed of a gold-germanium composition and provide means by which signals can be coupled to and from the device.

The growth technique for fabricating the structure shown in FIG. 1 comprises molecular beam epitaxy (MBE) and is a known process which involves the use of selected molecular beams for condensation on a heated substrate in an ultra high vacuum environment. This process has been disclosed, for example, in a publication entitled, "Structures Grown By Molecular Beam Epitaxy", L. L. Chang, et al., J. Vac. Ac. Sci. Technol. Vol. 10, No. 5, September/October, 1973, page 655. Due to the relatively slow growth rate and low substrate temperature, very precise epilayer thicknesses and abrupt doping profiles are obtainable.

This now leads to a consideration of the preferred embodiment of the invention which is shown in FIG. 2. Referring now to FIG. 2, there is shown a millimeter wave integrated circuit structure comprising a subharmonically pumped signal mixer utilizing a single planar doped barrier PDB diode chip 30 incorporating a planar doped barrier diode 10 as shown in FIG. 1. The PDB diode chip 30 is grown by the selective deposition of suitably doped gallium arsenide on a predetermined centralized area 31 of a semi-insulating GaAs dielectric waveguide member 11 comprised of two portions 32 and 34 which extend in mutually opposite directions on a metallic ground plane 36. The area 31 is formed by etching out a portion of the dielectric waveguide member 11. Coupling of the PDB diode chip 30 to the dielectric waveguide portions 32 and 34 is by way of biconical transformer elements 38 and 40 in the form of beam leads and which operate to insure optimum impedance match between the diode active junction and the GaAs dielectric waveguide member 11. The beam lead 40, for example, couples to a contact layer such as layer 26

(FIG. 1) while the beam lead 38 couples to the contact layer such as layer 24.

Further as shown in FIG. 2, the dielectric waveguide portion 32 terminates in a tapered end section 42 which extends into a metal to dielectric waveguide transition section 44. The transition section 44 couples to an input signal source, not shown, comprising a signal in the millimeter wave frequency range. At the outer end of the dielectric waveguide portion 32 is located a dielectric waveguide isolator 46 along one edge thereof and is adapted to typically provide 30 db of isolation and operates in conjunction with a corresponding isolator element 48 formed at the outer end of the other dielectric waveguide portion 34 for providing signal isolation between the input signal source and a local oscillator signal source, the latter being coupled to the dielectric waveguide 34 via the tapered end 50 and the metal to dielectric waveguide transition section 52.

Thus the input signal and the local oscillator signals are fed in a balanced mixer configuration from opposite directions to the PDB chip 30. A planar doped barrier diode comprises an intrinsic subharmonic signal mixing device and accordingly the local oscillator input signal comprises a signal which is at one half the frequency of the input signal. This feature provides an extremely desirable asset at the higher millimeter wave frequencies for reliability and low cost considerations.

An IF output circuit is additionally formed on the ground plane 36 and comprises a microstrip transmission line 54 formed over a layer of insulation 56. The IF circuit extends at right angles relative to the dielectric waveguides 32 and 34 and if fabricated on an outwardly projecting segment 58 of the ground plane 36. The microstrip transmission line 54, moreover, includes a low pass filter section 60 and is wire bonded to the PDB diode chip 30 by means of a wire 62 connected between the point 64 and the diode contact layer 28 (FIG. 1).

Thus what has been shown and described is an intrinsic subharmonic mixer which allows the local oscillator to operate at one half the frequency of the input signal. The monolithic construction shown in FIG. 2, moreover, simplifies balanced mixer fabrication since only one PDB diode is required rather than two of the Schottky barrier type as before. Additionally, since the PDB mixer diode is a bulk majority carrier device instead of a surface device, the power handling capability will be significantly increased over other known apparatus.

While there has been shown and described what is at present considered to be the preferred embodiment of the invention, it is to be noted that the same has been made by way of illustration and not limitation. Accordingly, all modifications, alterations and changes coming within the spirit and scope of the invention as set forth in the appended claims are herein meant to be included.

We claim:

1. A monolithic signal mixer for millimeter wave frequency applications, comprising:
   a dielectric transmission line medium including a semi-insulating substrate of a given material located on a conductive ground plane, said dielectric transmission line including first and second transmission line portions extending in opposite directions along said ground plane and an intermediate area of reduced thickness separating said portions;
   a monolithic semiconductor signal mixing device including a substrate of said given material integral with and grown on said intermediate area and spaced from the intermediate area ends of said transmission line, said mixing device including conductive means coupling across said area of reduced thickness to respective said intermediate ends of each of said first and second transmission line portions;
   an input signal source and a local oscillator signal source being respectively coupled to opposite ends of said transmission line; and
   intermediate frequency transmission line means located on said ground plane and being coupled to said mixing device for translating an intermediate frequency signal resulting from the heterodyne action between said input signal and said local oscillator signal.

2. The mixer as defined by claim 1 wherein said monolithic semiconductor mixing device comprises a planar doped barrier semiconductor device grown on said semi-insulating dielectric transmission line at said intermediate area.

3. The signal mixer as defined by claim 2 wherein said planar doped barrier semiconductor device comprises a planar doped barrier diode.

4. The signal mixer as defined by claim 3 wherein said means coupling across said area of reduced thickness includes a pair of beam leads respectively coupling said planar doped barrier diode to said intermediate ends of said first and second transmission line portions for providing optimum impedance match between said diode and said dielectric transmission line.

5. The signal mixer as defined by claim 3 wherein said planar doped barrier diode is grown on said region of reduced thickness by molecular beam epitaxy.

6. The signal mixer as defined by claim 5 wherein the frequency of said local oscillator signal is substantially one half the frequency of said input signal.

7. The signal mixer as defined by claim 5 wherein said dielectric waveguide is comprised of a group III-V compound.

8. The signal mixer as defined by claim 5 wherein said dielectric waveguide is comprised of gallium arsenide.

9. The signal mixer as defined by claim 8 wherein said planar doped barrier diode comprises an $n^+$-i-$p^+$-i-$n^+$ epilayered semiconductor structure.

10. The signal mixer as defined by claim 3 and additionally including dielectric waveguide isolator means located on said first and second portions of said dielectric transmission line between the respective intermediate and opposite ends thereof for isolating said input signal and said local oscillator signal to the location of the planar doped barrier diode.

11. The signal mixer as defined by claim 3 and additionally including first and second metal to dielectric waveguide transition means located at said opposite ends of said first and second transmission line portions for coupling said input signal and said local oscillator signal to said dielectric transmission line.

12. The signal mixer as defined by claim 3 wherein said intermediate frequency transmission line means includes microstrip transmission line means extending transversely from said dielectric transmission line and formed on a layer of insulation located on said ground plane and having a connection to said signal mixing device.

13. The signal mixer as defined by claim 12 wherein said microstrip transmission line means is configured to include a low pass filter.

* * * * *